United States Patent
Kim

(10) Patent No.: US 7,269,070 B2
(45) Date of Patent: Sep. 11, 2007

(54) FLASH MEMORY DEVICE WITH MULTIPLE ERASE VOLTAGE LEVELS

(75) Inventor: Moo-Sung Kim, Gyeonggi-do (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

(21) Appl. No.: 11/383,157

(22) Filed: May 12, 2006

(65) Prior Publication Data
US 2007/0047328 A1 Mar. 1, 2007

(30) Foreign Application Priority Data
Aug. 23, 2005 (KR) ........................ 10-2005-0077482

(51) Int. Cl.
*G11C 16/08* (2006.01)

(52) U.S. Cl. ............... 365/185.23; 365/185.33; 365/185.29; 365/185.12; 365/185.11; 365/185.17

(58) Field of Classification Search ........... 365/185.29, 365/185.33, 185.02, 185.09, 185.12, 185.11, 365/185.17, 185.23
See application file for complete search history.

(56) References Cited

U.S. PATENT DOCUMENTS

| | | | | |
|---|---|---|---|---|
| 5,274,587 A * | 12/1993 | Koyama | ............... | 365/185.17 |
| 5,280,454 A * | 1/1994 | Tanaka et al. | ......... | 365/185.17 |
| 5,293,212 A * | 3/1994 | Yamamoto et al. | ........ | 365/218 |
| 5,309,402 A * | 5/1994 | Okazawa | .................. | 365/218 |
| 5,499,212 A * | 3/1996 | Amanai | ..................... | 365/218 |
| 5,673,223 A * | 9/1997 | Park | ..................... | 365/185.17 |
| 5,673,224 A * | 9/1997 | Chevallier et al. | ..... | 365/185.23 |
| 5,995,417 A * | 11/1999 | Chen et al. | ............ | 365/185.29 |
| 6,130,839 A * | 10/2000 | Chang | ................... | 365/185.18 |
| 6,246,608 B1 | 6/2001 | Odani | ..................... | 365/185.2 |
| 6,301,156 B1 * | 10/2001 | Kurosaki | ................ | 365/185.2 |
| 6,463,516 B1 | 10/2002 | Leong et al. | ............... | 711/170 |
| 6,621,743 B2 * | 9/2003 | Ogane | .................. | 365/185.23 |
| 6,807,119 B2 * | 10/2004 | Fasoli et al. | ................ | 365/210 |

FOREIGN PATENT DOCUMENTS

| | | |
|---|---|---|
| JP | 2003-051193 | 2/1993 |
| JP | 2000-348493 | 12/2000 |
| JP | 2005-032368 | 2/2005 |

OTHER PUBLICATIONS

English language abstract of Japanese Publication No. 2000-348493.
English language abstract of Japanese Publication No. 2003-051193.
English language abstract of Japanese Publication No. 2005-032368.

* cited by examiner

*Primary Examiner*—Andrew Q. Tran
(74) *Attorney, Agent, or Firm*—Marger Johnson & McCollom, P.C.

(57) ABSTRACT

In some embodiments, a string of nonvolatile memory cells may be erased by driving their control gates with erase voltages that may have different levels for different cells. The cells may be divided into two or more groups, and the cells in each group may be driven by the same erase voltage. In another embodiment, a nonvolatile memory device may include a cell array having two groups of memory cells, and the memory cells in different groups may be simultaneously driven with erase voltages having different levels during an erase operation.

20 Claims, 7 Drawing Sheets

FLASH MEMORY DEVICE WITH MULTIPLE ERASE VOLTAGE LEVELS

This application claims priority to Korean Patent Application No. 2005-77482, filed Aug. 23, 2005, which is hereby incorporated by reference in its entirety.

BACKGROUND

Integrated circuit memory devices are typically classified into two categories: random access memory (RAM) and read only memory (ROM) devices. Random access memory (RAM) devices are typically volatile memory devices that lose their data when power to the memory is interrupted. In contrast, read only memory (ROM) devices are typically non-volatile memory devices that retain their data even when power is interrupted. Examples of non-volatile memory devices include programmable ROM (PROM), erasable programmable ROM (EPROM) and electrically erasable programmable ROM (EEPROM). Flash memory devices may be classified into two groups, NOR flash and NAND flash, based on the type of logic gate used in each storage device.

In NAND flash memory devices, an erase operation is performed in block units. During an erase operation, a high voltage of about 20V is applied to the bulk, and an erase voltage of about 0V is applied to the gates of the memory cells. Electrons are injected from a floating gate to a channel by F-N tunneling. This operation is referred to as "erase operation". As a result of an erase operation, NAND flash memory devices store data "1" to the memory cells.

In a conventional NAND flash memory device, during an erase operation, an erase voltage with the same level is applied to all word lines. A problem with this, however, is that the threshold voltage profile of the memory cells spreads so that different cells have different threshold voltages.

An erase operation is simultaneously performed with on all memory cells in a memory blocks. Preferably, memory cells that are simultaneously erased should have substantially equal channel lengths. However, due to limitations in semiconductor manufacturing processes, it is difficult to fabricate memory cells with equal channel lengths. If the memory cells have different channel lengths, they also have different capacitance coupling ratios during an erase operation. Variation in capacitance coupling ratios result in different erase speeds for different memory cells. As a result, the threshold voltage profile of the memory cells is spread after an erase operation.

SUMMARY

In one embodiment, a NAND flash memory device according to the present invention may include a cell array connected to a plurality of word lines, and an erase voltage generating circuit adapted to generate erase voltages to be provided to the plurality of word lines, wherein the erase voltages may have different levels for different word lines. A fuse box may be included to store erase voltage information for the memory cells.

In another embodiment of the present invention, a string of nonvolatile memory cells having control gates may be erased by generating more than one erase voltage, and driving the control gates of the cells with the erase voltages, wherein the erase voltages for different cells may have different levels. The cells may be divided into two or more groups, and the cells in each group may be driven by the same erase voltage.

In another embodiment of the present invention, a non-volatile memory device may include a cell array having two groups of memory cells, and an erase voltage generating circuit to generate more than one erase voltage, wherein the memory cells in different groups may be simultaneously driven with erase voltages having different levels during an erase operation. The memory cells may be arranged in strings, and cells in the same string may be in different groups.

DETAILED DESCRIPTION

Figure 1:
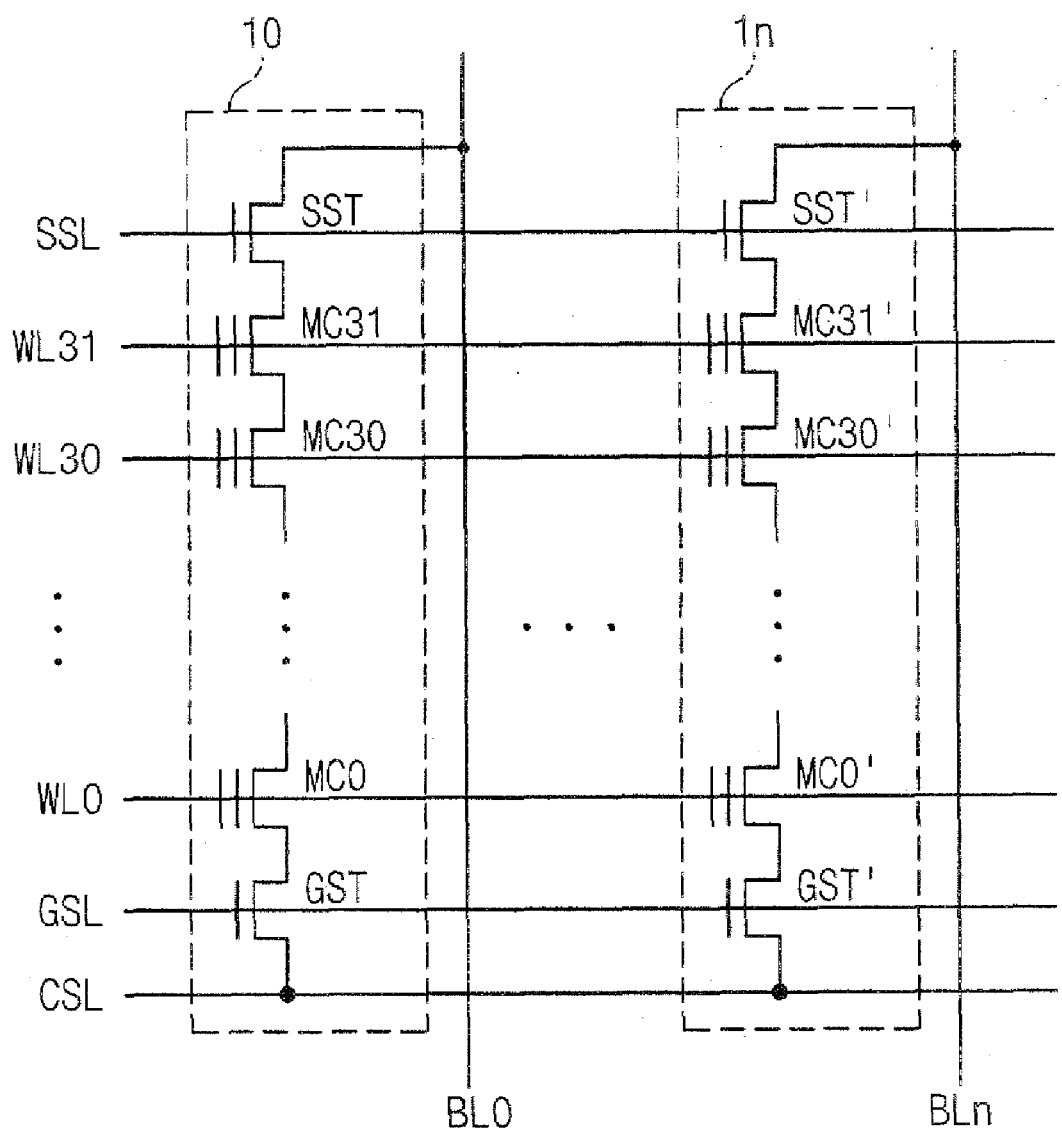
FIG. 1 illustrates a flash memory cell array.

FIG. 1 is a circuit diagram showing a memory cell array of a NAND flash memory device. A memory cell array 1 is constructed of a plurality of cell strings 10~1n. Each of the cell strings has the same structure and is connected between bit lines BL0~BLn and common source line CSL.

The cell string 10 is connected to the bit line BL0. The cell string 10 is formed of a ground selection transistor GST, a plurality of memory cells MC0~MC31, and a string selection transistor SST, which are connected in series. The ground selection transistor GST is coupled to the common source line CSL, and the string selection transistor SST is connected to the bit line BL0. The plurality of memory cells MC0~MC31 are coupled between the ground selection transistor GST and the string selection transistor SST. The number of the memory cells may vary such as 16, 32, 64, and so forth.

The gates of the plurality of memory cells MC0~MC31 are connected to a plurality of word lines WL0~WL31. The gate of the string selection transistor SST is connected to the string selection line SSL. The gate of the ground selection transistor GST is connected to the ground selection line GSL.

During an erase operation, the ground selection line, the string selection line, the common source line, and bit line are in a floating state. A high voltage of about 20V is applied to the bulk of the memory device, and an erase voltage is applied to the word line. The erase voltages applied to each of the word lines may have different levels.

Figure 2:
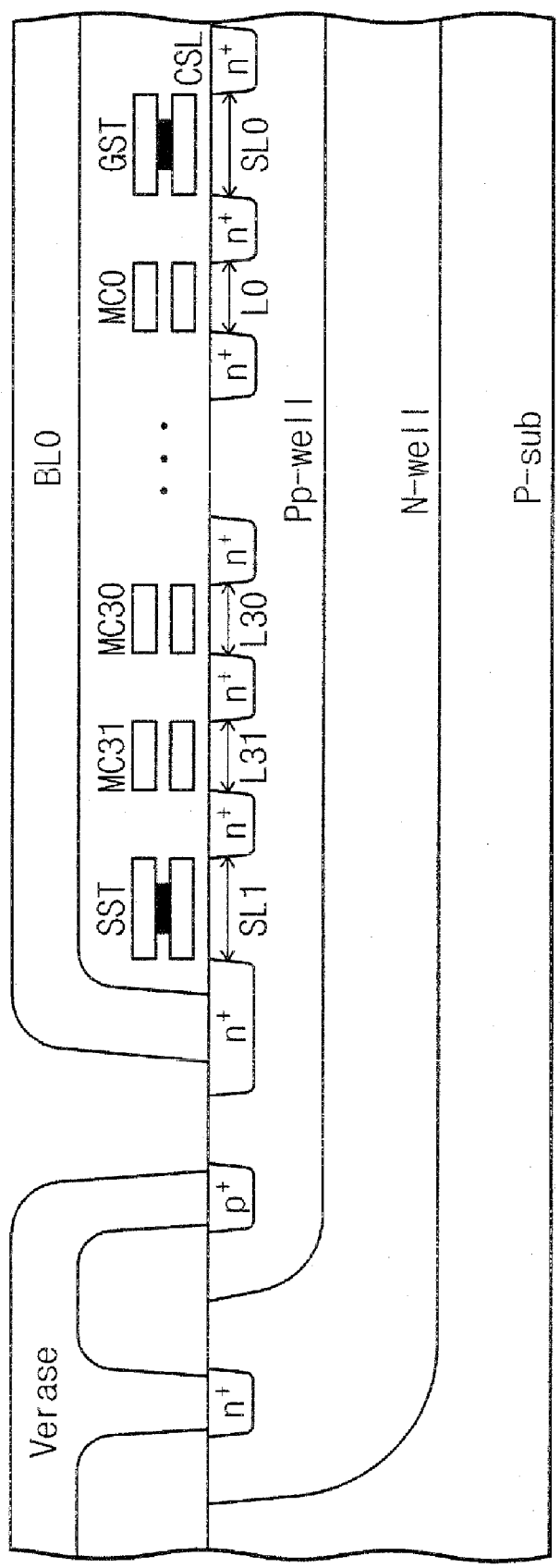
FIG. 2 illustrates a sectional view of a cell string in the memory cell array shown in FIG. 1.

FIG. 2 is a sectional-view of the cell string 10 of the memory cell array shown in FIG. 1. A pocket P-well (Pp_well) is formed at a predetermined depth from a P-type substrate (P-sub) and surrounded by N-well (N_well). The n+ regions doped with N+ impurities are formed in the pocket P-well and isolated between channels. During an erase operation, a high voltage Verase higher than power voltage Vcc (e.g., a voltage of about 20V) is applied to the pocket P-well, and erase voltages having different levels are applied to each of the word lines.

Referring to FIG. 2, the channel length of the ground selection transistor GST is SL0, and the channel length of the string selection transistor SST is SL1. The channel lengths of the memory cells MC0~MC31 are L0~L31, respectively. The channel lengths SL0 and SL1 of the selection transistor are longer than those (L0~L31) of the memory cells.

Preferably, each of the memory cells has the same channel length. However, due to limitations of the semiconductor manufacturing process, the channel lengths of different memory cells may not be equal. If the channel lengths of the memory cells are different, there is a variation in the capacitance coupling ratio of the memory cells during an erase operation. Because of the variations in the capacitance coupling ratio, the erase speed is different for different memory cells. As a result, the threshold voltage profile of the memory cell is spread alter an erase operation. In order to reduce the threshold voltage profile of the memory cell, in accordance an embodiment of the present invention, erase voltages having different levels may be applied to each of the word lines during an erase operation.

Figure 3:
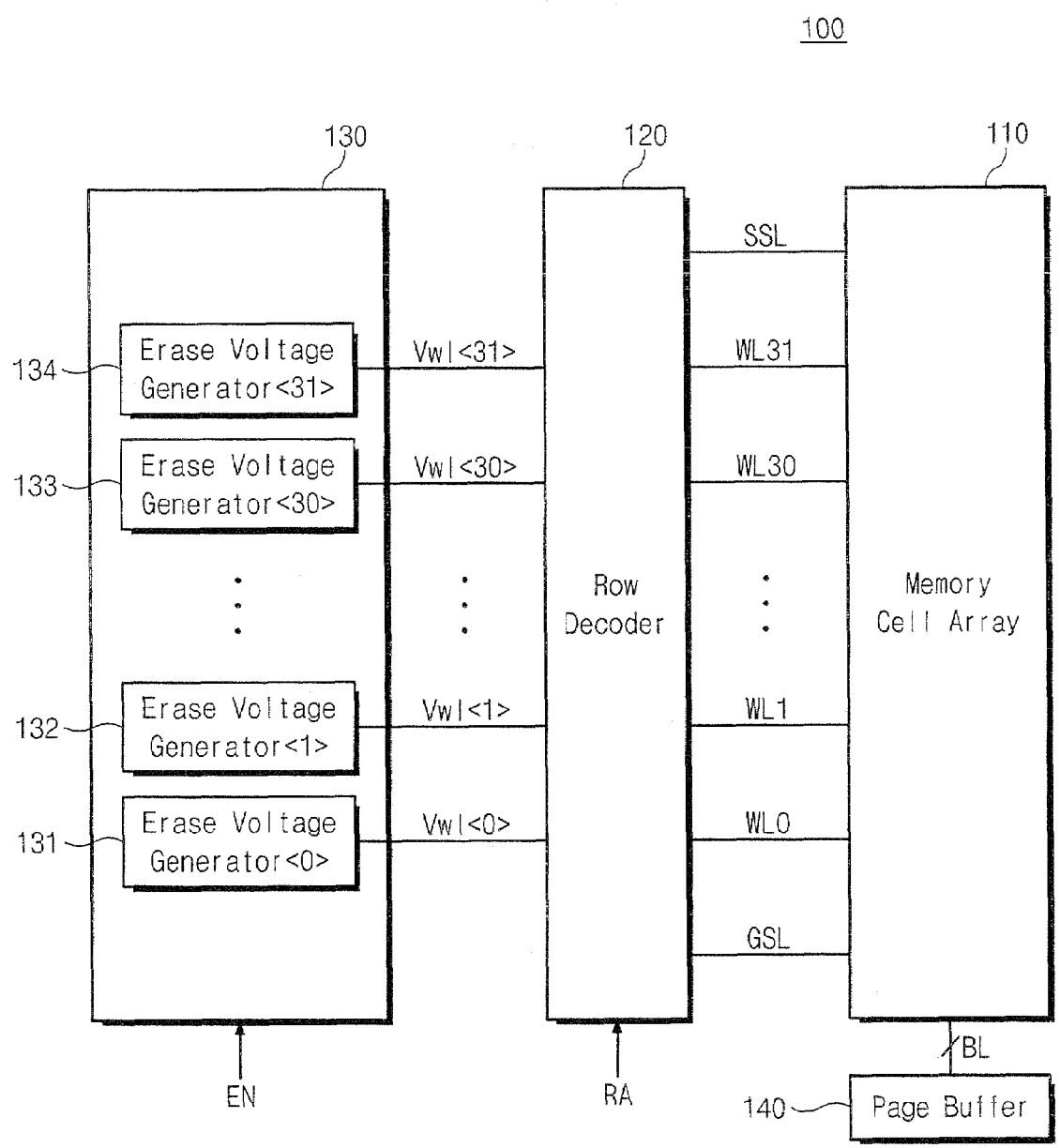
FIG. 3 is a block diagram showing a flash memory device in accordance with a first embodiment of the present invention.

FIG. 3 is a block diagram showing a NAND flash memory device according to a preferred embodiment of the present invention. Referring to FIG. 3, a NAND flash memory device 100 includes a memory cell array 110, a row decoder 120, an erase voltage generating circuit 130, and a page buffer 140.

The memory cell array 110 is connected to a ground selection line GSL, a plurality of word lines WL0~WL31, and a string selection line SSL. The memory cell array 110 is connected to the page buffer 140 by a bit line BL. During an erase operation, the selection lines GSL and SSL, and the bit line BL are in a floating state. Erase voltages having different levels are applied to each of the word lines WL0~WL31.

The row decoder 120 applies a bias voltage to a selected word line in response to a row address RA. During a program/read operation, each of program voltages Vpgm and read voltages Vread is applied to a word line selected from WL0~WL31. During an erase operation, erase voltages having different levels are applied to the plurality of word lines WL0~WL31.

An erase voltage generating circuit 130 generates a plurality of erase voltages (Vw1<i>, where i=0~31) to be applied to the plurality of word lines WL0~WL31. The erase voltages have different voltage levels corresponding to each of the word lines. Referring to FIG. 3, the erase voltage generating circuit 130 includes a plurality of erase voltage generators (Erase Voltage Generator<i>, where i=0~31) corresponding to each of the word lines. Each of the erase voltage generators is operated in response to an erase enable signal EN. In this case, the erase enable signal EN is an external signal for instructing an erase operation to the NAND flash memory device 100. Each of the erase voltage generators has the same construction and operating principles.

Figure 4:
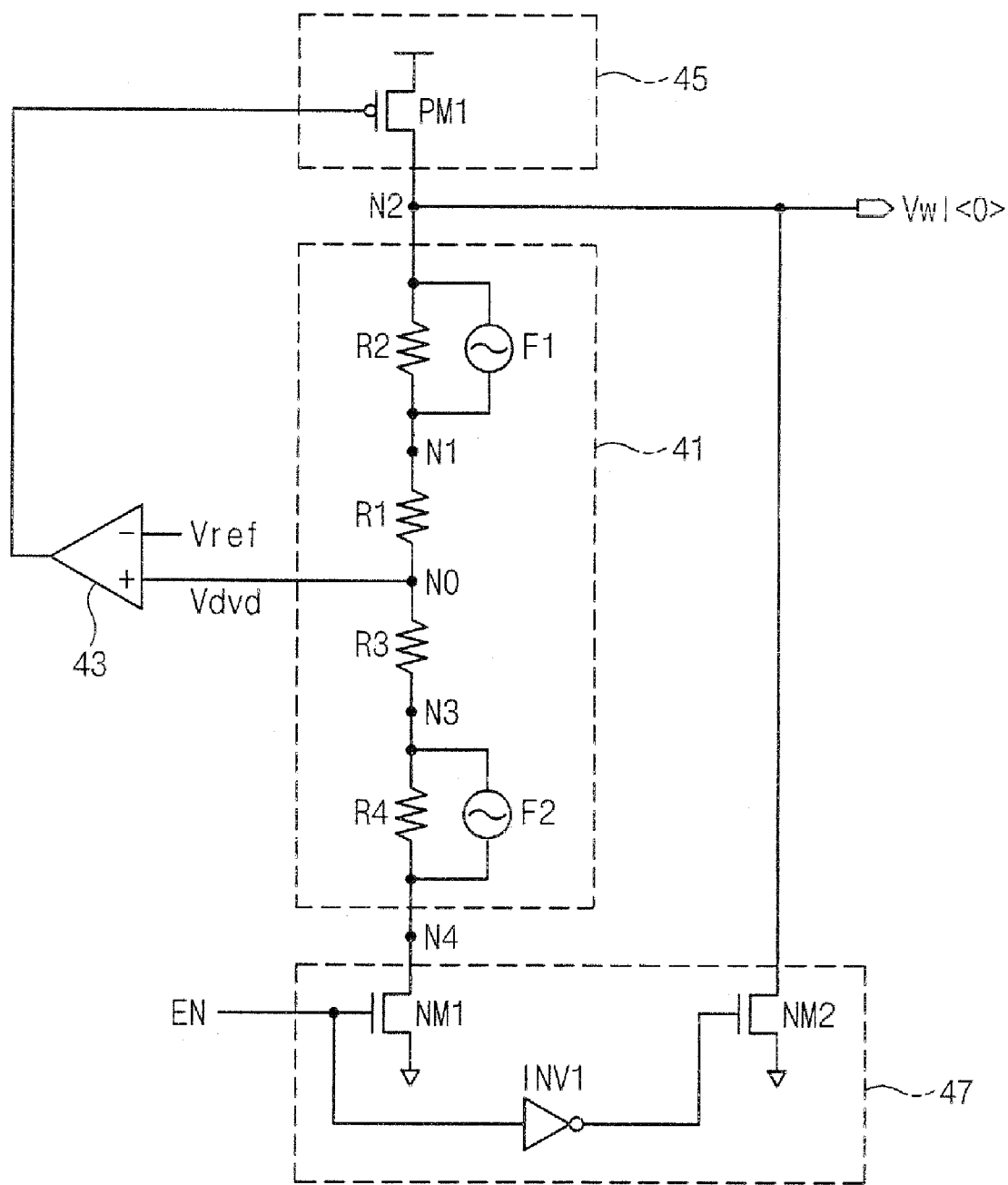
FIG. 4 is a circuit diagram showing an example embodiment of the erase voltage generator of FIG. 3.

FIG. 4 illustrates an embodiment of the erase voltage generator 131 of FIG. 3. Referring to FIG. 4, the erase voltage generator 131 includes a voltage divider 41, a comparator 43, a pull-up driver 45, and an enable circuit 47.

The voltage driver 41 includes a first variable resistance and a second variable resistance. The first variable resistance is connected between a dividing node N0 and a second node N2, and the second variable resistance is connected between the dividing node N0 and a fourth node N4. In this case, the second node N2 is connected to an output node, and the fourth node N4 is grounded through enable circuit 47.

The first variable resistance includes a first resistance R1, a second resistance R2, and a first fuse F1. The first resistance R1 is connected between the dividing node N0 and the first node N1. The second resistance R2 is connected between the first node N1 and the second node N2. The fuse F1 is connected in parallel with the second resistance R2. The first variable resistance is controlled by cutting the first fuse F1. If the first fuse F1 is cut, the first variable resistance increases, which results in an increase in the output voltage Vw1<0>.

The second variable resistance includes a third resistance R3, a fourth resistance R4, and a second fuse F2. The third resistance R3 is connected between the dividing node N0 and a third node N3. The fourth resistance R4 is connected between the third node N3 and a fourth node N4. The second fuse F2 is connected in parallel with the fourth resistance R4. The second variable resistance is controlled by cutting the second fuse F2. Cutting the second fuse F2 increases the second variable resistance, which in turn decreases the output voltage Vw1<0>.

As shown in FIG. 4, the voltage divider 41 includes four resistances R1~R4 and two fuses F1 and F2. The inventive principles, however, are not limited to these particular embodiments, and other effective arrangements can be devised in accordance with the inventive principles of this patent disclosure. For example, the voltage divider 41 may have different numbers of resistances and fuses.

The comparator 43 compares a reference voltage Vref and the voltage Vdvd of the dividing node N0. If the dividing voltage Vdvd is lower than the reference voltage Vref, the comparator 43 outputs a comparison signal. In this case, the reference voltage Vref is generated from a reference voltage generator (not shown).

The pull-up driver 45 is connected between a power terminal and an output terminal. In addition, the pull-up driver 45 provides an erase voltage Vw1<0> having a constant level to the output terminal in response to the comparison signal. Referring still to FIG. 4, the pull-up driver 45 is constructed of a PMOS transistor PM1. The PMOS transistor has a source connected to the power terminal, a drain connected to the output terminal, and a gate receiving the comparison signal.

The enable circuit 47 drives the erase voltage generator 131 in response to the erase enable signal EN. The enable circuit 47 includes two NMOS transistors NM1 and NM2, and one inverter INV1. The first NMOS transistor NM1 is connected between the fourth node N4 and a ground, and is controlled in response to the erase enable signal EN. The second NMOS transistor NM2 is connected between the second node N2 and a ground, and is controlled in response to an inverted erase enable signal/EN.

The enable circuit 47 drives the erase voltage generator 131 if an erase enable signal EN has a high level during an erase operation. At this time, the first NMOS transistor NM1 is turned on, and the second NMOS transistor NM2 is turned off. In contrast, the enable circuit 47 does not drive the erase voltage generator 131 if an erase enable signal EN is low. At this time, the first NMOS transistor NM1 is turned off, and the second NMOS transistor NM2 is turned on. If the second NMOS transistor NM2 is turned on, the output terminal is grounded.

Referring still to FIG. 3, the NAND flash memory device 100 includes erase voltage generators, each of which corresponds to one of the word lines. According to the NAND flash memory device shown in FIG. 3, an erase voltage having different levels can be provided to each of the word lines during an erase operation, which may thereby reduce the threshold voltage profile after erase operation.

Figure 5:
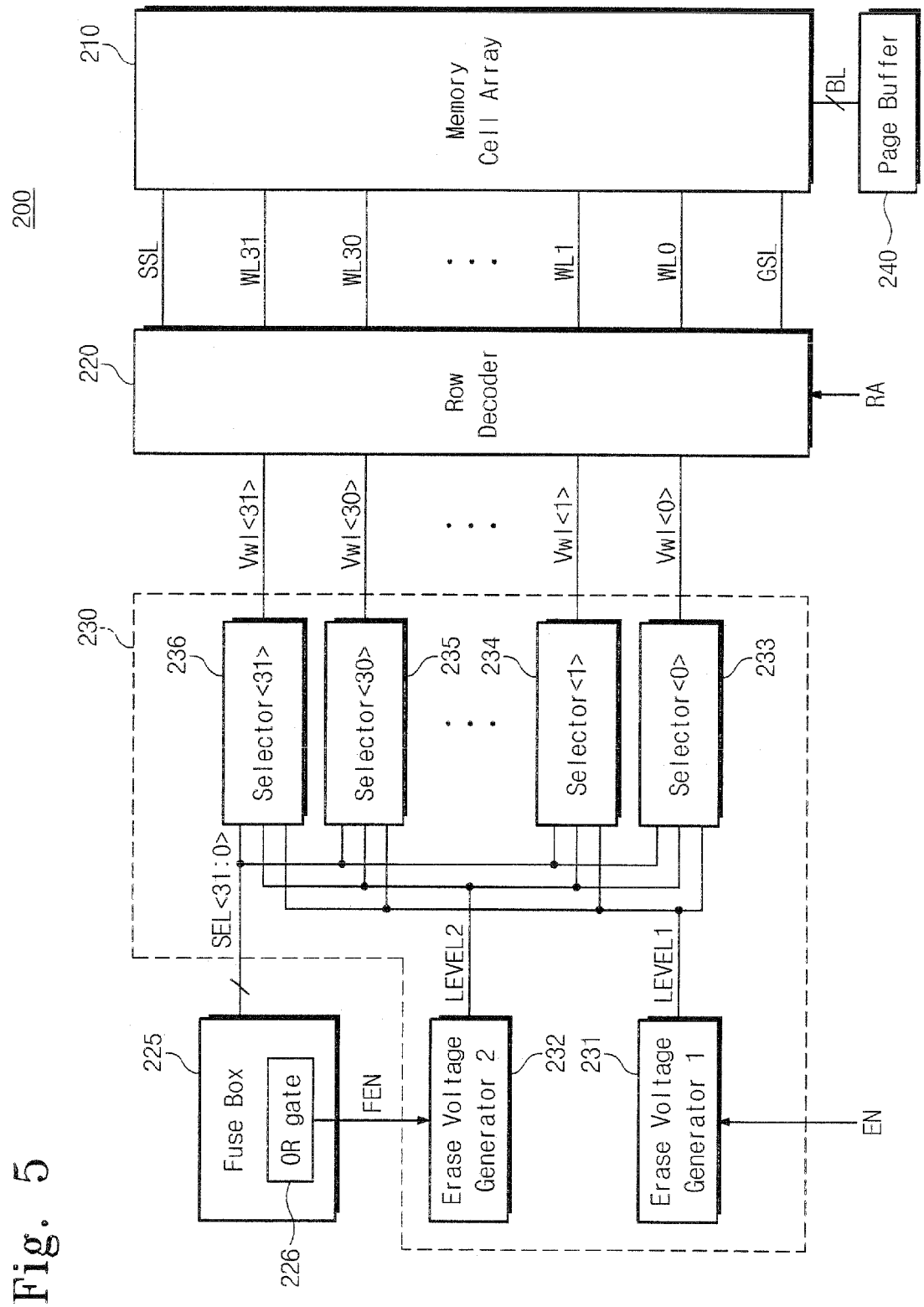
FIG. 5 is a block diagram showing a flash memory device in accordance with another embodiment of the present invention.

FIG. 5 is a block diagram illustrating a flash memory device according to another embodiment of the present invention. The flash memory device 200 of FIG. 5 includes thirty-two word lines WL0~WL31. Providing thirty two erase voltage generators, one corresponding to each word line, would increase the area of the flash memory device. To overcome such a problem, a NAND flash memory device 200 of FIG. 5 classifies a plurality of memory cells into two groups based on capacitance coupling ratio. The NAND flash memory device 200 uses two erase voltage generators generating two levels of erase voltage which are provided to the two groups.

Referring to FIG. 5, the NAND flash memory device 200 includes a memory cell array 210, a row decoder 220, a fuse box 225, an erase voltage generating circuit 230, and a page buffer 240. The memory cell array 210, the row decoder 220, and the page buffer 240 may be the same as described before in connection to FIG. 3.

The fuse box 225 stores information on the erase voltage to be applied to each of the word lines. The fuse box 225 includes fuses corresponding to each of the word lines. In addition, the fuse box 225 generates each of selection signals (SEL<i>, where i=0~31) by cutting the fuses. For instance, if a fuse in the fuse box 225 is cut off, a selection signal having a high level is generated. In contrast, if a fuse in the fuse box 225 is connected, a selection signal having a low level is generated. Referring to FIG. 5, the fuse box 225 includes an OR gate 226. The OR gate 226 receives the selection signals (SEL<i>, where i=0~31). When at least one selected from the selection signals is in a high level, the OR gate 226 generates an enable signal FEN, i.e., drives it to a high level.

The erase voltage generating circuit 230 includes a first erase voltage generator 231, a second erase voltage generator 232, and a selection circuit constructed of a plurality of selectors (Selector<i>, where i=0~31).

The first erase voltage generator 231 generates a first erase voltage LEVEL 1 in response to the first erase enable signal EN. The second erase voltage generator 232 generates a second erase voltage LEVEL 2 in response to the second erase enable signal FEN. Each of the selectors selectively outputs the first erase voltage LEVEL 1 or the second erase voltage LEVEL 2 in response to the selection signals.

The first erase voltage generator 231 has the same construction and operating principles as the erase voltage generators 131 of FIG. 4. All the selectors have similar construction and operating principles. An example embodiment of one of the selectors will be illustrated in FIG. 7.

Figure 6:
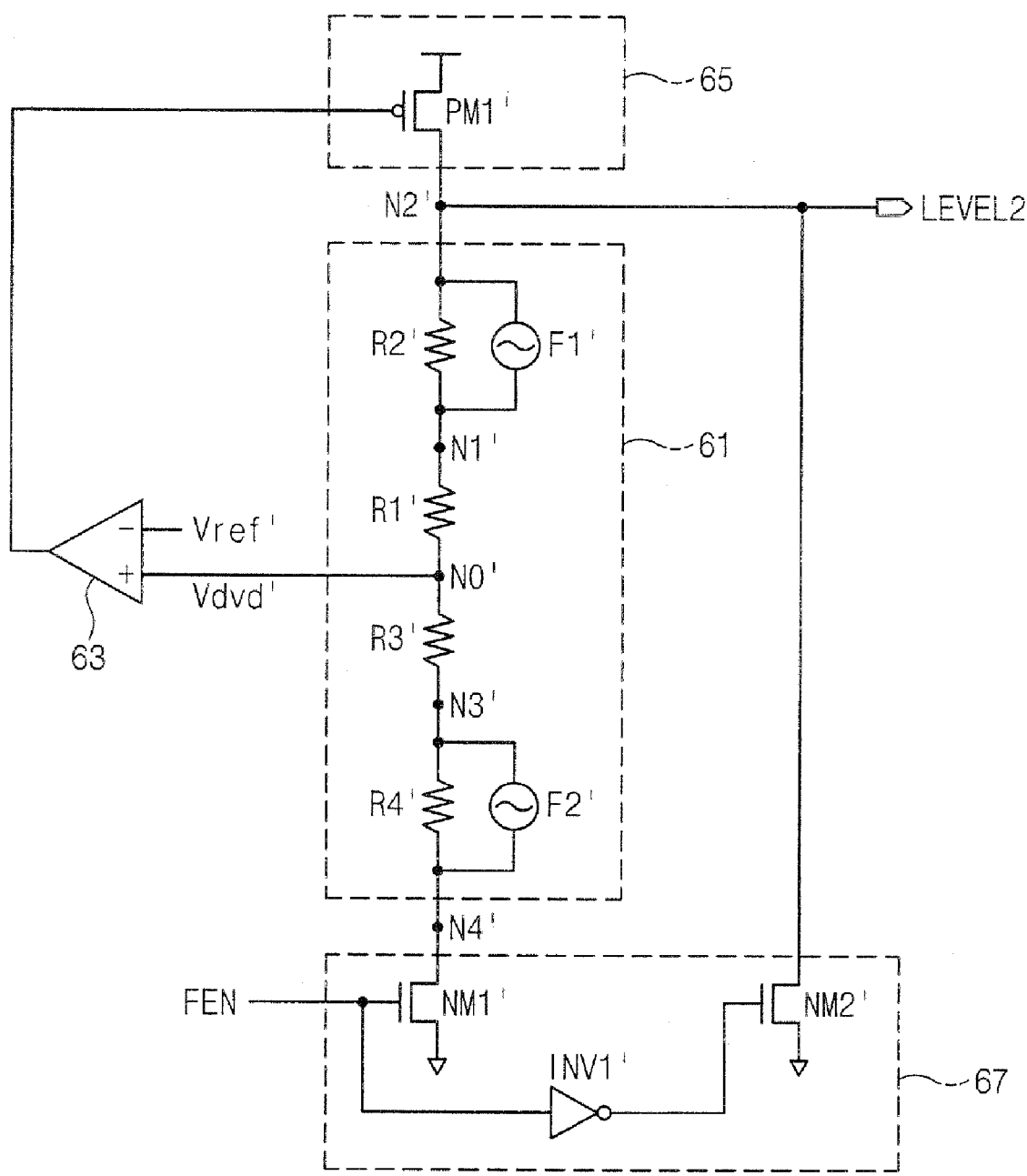
FIG. 6 is a circuit diagram showing an example embodiment of the erase voltage generator of FIG. 5.

FIG. 6 is a circuit diagram showing an example embodiment of the second erase voltage generator 232 of FIG. 5. The second erase voltage generator 232 has the same construction as the first erase voltage generator 131. The second erase voltage generator 232 is operated in response to the second erase enable signal FEN provided by the OR gate 226 of the fuse box 225 to generate the second erase voltage LEVEL 2.

Figure 7:
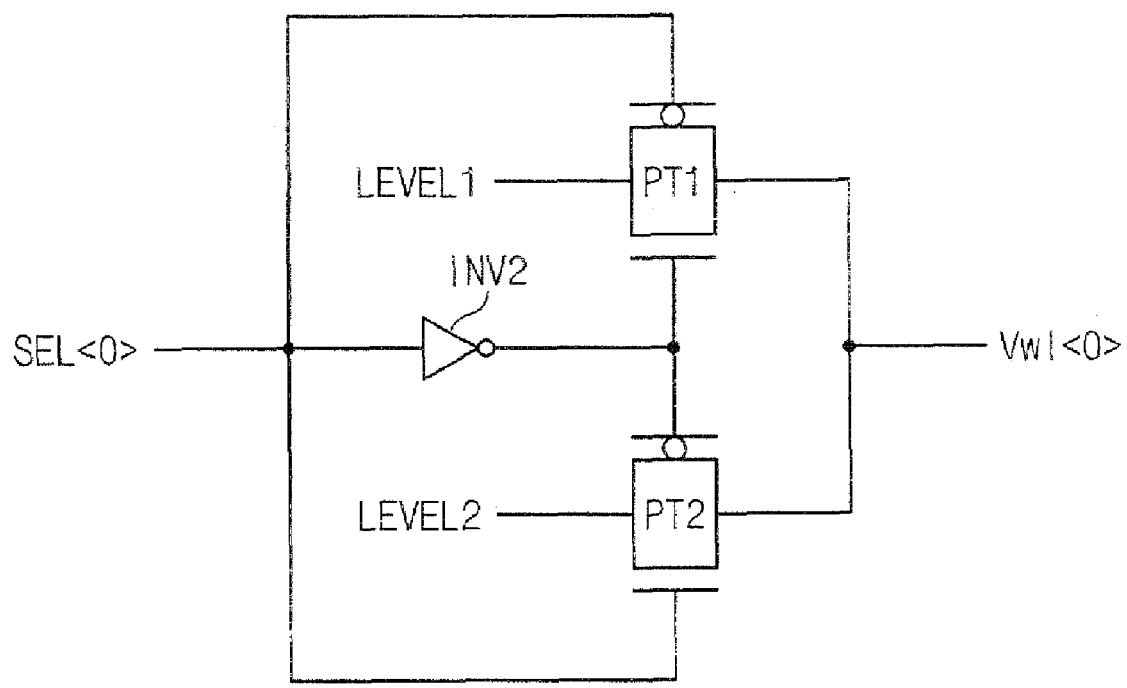
FIG. 7 is a circuit diagram showing an example embodiment of the selector of FIG. 5.

FIG. 7 illustrates an embodiment of a circuit diagram showing the selector 233 of FIG. 5 according to the inventive principles of this patent disclosure. Referring to FIG. 7, the selector 233 includes two pass transistors PT1 and PT2, and one inverter INV2. The first pass transistor PT1 transmits the first erase voltage LEVEL 1 in response to the selection signal SEL<0>. The second pass transistor PT2 transmits the second erase voltage LEVEL 2 in response to the selection signal SEL<0>. If the selection signal SEL<0> is low, the selector 233 transmits the first selection signal LEVEL 1 through the first pass transistor PT1. In this case, output voltage Vw1<0> of the selector 233 is the first erase voltage LEVEL 1. If the selection signal SEL<0> is high, the selector 233 transmits the second selection signal LEVEL 2 through the second pass transistor PT2. In this case, output voltage Vw1<0> of the selector 233 is the second erase voltage LEVEL 2.

Referring still to FIG. 5, the NAND flash memory device 200 classifies a plurality of memory cells into two groups considering capacitance coupling ratio. The NAND flash memory device 200 stores information with respect to the first and second erase voltages LEVEL 1 and LEVEL 2, which are provided to the two groups of memory cells during an erase operation. The NAND flash memory device 200 provides the first erase voltage LEVEL 1 or the second erase voltage LEVEL 2, to each of the word lines according to the information stored in the fuse box. Since the NAND flash memory device 200 provides an erase voltage having different levels to each of the word lines during an erase operation, it may be possible to reduce the threshold voltage profile after an erase operation. Furthermore, the NAND flash memory device 200 of FIG. 5 has fewer erase voltage generators in comparison with the NAND flash memory device 100 of FIG. 3, As a result, it may be possible to reduce the area of the NAND flash memory device.

As previously mentioned, the flash memory device according to the present invention can provide erase voltages having different levels to each of the word lines or groups of word lines, thereby reducing a threshold voltage profile after erase operation.

The invention has been described using exemplary embodiments; however, it will be understood that the scope of the invention is not limited to only the disclosed embodiments. Rather, the scope of the invention is intended to encompass various modifications and similar arrangements. The scope of the claims, therefore, should be accorded the broadest interpretation so as to encompass all such modifications and similar arrangements.

The invention claimed is:

1. A NAND flash memory device comprising:
    a cell array connected to a plurality of word lines; and
    an erase voltage generating circuit coupled to the cell array, to generate erase voltages to be provided to the plurality of word lines;
    wherein the erase voltages have different levels for different word lines.

2. The NAND flash memory device of claim 1, wherein the erase voltage generating circuit includes a plurality of erase voltage generators corresponding to each of the word lines, and
    wherein the plurality of erase voltage generators are operated in response to an erase enable signal.

3. The NAND flash memory device of claim 2, wherein each of the erase voltage generators comprises:
    a voltage divider having a first variable resistance connected between an output terminal and a dividing node, and a second variable resistance connected between the dividing node and a ground node;
    a comparator to compare a reference voltage with a dividing node voltage, the comparator outputting a comparison signal when the dividing node voltage becomes lower than the reference voltage;

a pull-up driver connected between a power terminal and the output terminal to provide an erase voltage to the output terminal in response to the comparison signal; and an enable circuit to drive the erase voltage generator in response to the erase enable signal.

4. The NAND flash memory device of claim 3, wherein the first and second variable resistances are controlled by cutting fuses.

5. The NAND flash memory device of claim 3, wherein the pull-up driver comprises a PMOS transistor.

6. A NAND flash memory device comprising:
a memory cell array connected to a plurality of word lines;
a fuse box to store erase voltage information; and
an erase voltage generating circuit coupled to the memory cell array, to generate erase voltages for the plurality of word lines according to the erase voltage information;
wherein the erase voltages have different levels for different word lines.

7. The NAND flash memory device of claim 6, wherein the fuse box stores information on the erase voltage for each of the word lines.

8. The NAND flash memory device of claim 6, wherein the erase voltage generating circuit comprises:
a first erase voltage generator to generate a first erase voltage in response to a first erase enable signal;
a second erase voltage generator to generate a second erase voltage in response to a second erase enable signal provided by the fuse box; and
a selection circuit to select the first erase voltage or the second erase voltage in response to the erase voltage information from the fuse box.

9. The NAND flash memory device of claim 8, wherein the first erase voltage generator comprises:
a voltage divider having a first variable resistance connected between an output terminal and a dividing node, and a second variable resistance connected between the dividing node and a ground node;
a comparator to compare a reference voltage with a dividing node voltage, the comparator outputting a comparison signal when the dividing node voltage becomes lower than the reference voltage;
a pull-up driver connected between a power terminal and the output terminal to provide an erase voltage to the output terminal in response to the comparison signal; and
an enable circuit to drive the first erase voltage generator in response to the first erase enable signal.

10. The NAND flash memory device of claim 8, wherein the second erase voltage generator comprises:
a voltage divider having a first variable resistance connected between an output terminal and a dividing node, and a second variable resistance connected between the dividing node and a ground node;
a comparator to compare a reference voltage with a dividing node voltage, the comparator outputting a comparison signal when the dividing node voltage becomes lower than the reference voltage;
a pull-up driver connected between a power terminal and the output terminal to provide an erase voltage to the output terminal in response to the comparison signal; and
an enable circuit to drive the second erase voltage generator in response to the second erase enable signal.

11. The NAND flash memory device of claim 8, wherein the selection circuit includes a plurality of selectors corresponding to each of the word lines.

12. The NAND flash memory device of claim 11, wherein each of the selectors selectively provide the first erase voltage or the second erase voltage to a corresponding word line in response to a selection signal from the fuse box.

13. A method of erasing a string of nonvolatile memory cells having control gates, the method comprising:
generating more than one erase voltage; and
driving the control gates of the cells with the erase voltages;
wherein the erase voltages for different cells have different levels.

14. The method of claim 13 wherein:
the control gate of each cell is coupled to a word line; and
driving the control gates comprises driving the word lines with the erase voltages.

15. The method of claim 13 wherein:
the cells are divided into two or more groups; and
the cells in each group are driven by the same erase voltage.

16. The method of claim 15 further comprising storing erase voltage information for the groups on an integrated circuit with the string of memory cells.

17. A nonvolatile memory device comprising:
a cell array having two groups of memory cells; and
an erase voltage generating circuit coupled to the cell array, to generate more than one erase voltage;
wherein the memory cells in different groups are simultaneously driven with erase voltages having different levels during an erase operation.

18. The memory device of claim 17 wherein:
the memory cells are arranged in strings; and
cells in the same string may be in different groups.

19. The memory device of claim 17 further comprising a fuse box to store erase voltage information for the memory cells.

20. The memory device of claim 19 where the erase voltage generating circuit comprises:
two or more erase voltage generators; and
two or more selectors to couple the erase voltage generators to the memory cells in response to the erase voltage information.

* * * * *

UNITED STATES PATENT AND TRADEMARK OFFICE
CERTIFICATE OF CORRECTION

PATENT NO. : 7,269,070 B2
APPLICATION NO. : 11/383157
DATED : September 11, 2007
INVENTOR(S) : Moo-Sung Kim It is certified that error appears in the above-identified patent and that said Letters Patent is hereby corrected as shown below:

Column 3, line 19, the word "alter" should read -- after --;
Column 3, line 46, the word "Vw1<i>" should read -- Vwl<i> --;
Column 4, line 12, the word "Vw1<0>" should read -- Vwl<0> --;
Column 4, line 22, the word "Vw1<0>"should read -- Vwl<0> --;
Column 4, line 38, the word "Vw1<0>" should read -- Vwl<0> --;
Column 6, line 4, the word "Vw1<0>" should read -- Vwl<0> --;
Column 6, line 8, the word "Vw1<0>" should read -- Vwl<0> --;
Column 6, line 26, the words "3, As" should read -- 3. As --.

Signed and Sealed this

Twenty-sixth Day of August, 2008

JON W. DUDAS
*Director of the United States Patent and Trademark Office*